United States Patent
Tsai et al.

(10) Patent No.: US 10,505,437 B2
(45) Date of Patent: Dec. 10, 2019

(54) POWER CONVERTING DEVICE AND GROUND IMPEDANCE VALUE DETECTING METHOD

(71) Applicant: DELTA ELECTRONICS, INC., Taoyuan (TW)

(72) Inventors: Tsung-Han Tsai, Taoyuan (TW); Po-Jen Hou, Taoyuan (TW); Chen-Wei Ku, Taoyuan (TW); Xin-Hung Lin, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 161 days.

(21) Appl. No.: 15/469,595

(22) Filed: Mar. 27, 2017

(65) Prior Publication Data
US 2018/0011149 A1    Jan. 11, 2018

(30) Foreign Application Priority Data

Jul. 7, 2016 (TW) ............................. 105121488 A

(51) Int. Cl.
*H02M 1/32* (2007.01)
*H02J 3/38* (2006.01)
(Continued)

(52) U.S. Cl.
CPC ............ *H02M 1/32* (2013.01); *G01R 15/146* (2013.01); *G01R 27/18* (2013.01); *G01R 31/40* (2013.01);
(Continued)

(58) Field of Classification Search
CPC ............ H02M 1/32; H02M 7/42; H02M 7/48; H02M 2001/0077; H02M 2001/32; H02M 3/04; H02M 2001/007; H02M 7/5387; H02M 3/158; G01R 27/18; G01R 31/40; G01R 15/146; G05B 15/02; H02J 3/383; Y02E 10/563; H02H 3/16
See application file for complete search history.

(56) References Cited

U.S. PATENT DOCUMENTS 8,018,748 B2 *  9/2011  Leonard ................ H02M 3/156
                                                         363/95
8,049,455 B2 * 11/2011  Kitanaka ................ B60L 3/003
                                                        318/563
(Continued)

FOREIGN PATENT DOCUMENTS

CN    102483434 A    5/2012
CN    103048544 A    4/2013
(Continued)

*Primary Examiner* — Kyle J Moody
(74) *Attorney, Agent, or Firm* — CKC & Partners Co., LLC

(57) ABSTRACT

A power converting device includes a DC-DC converting circuit, a DC-AC converting circuit, and an insulation detecting circuit. The DC-DC converting circuit is configured to convert a DC input voltage to a DC bus voltage. The DC-AC converting circuit is electrically coupled to the DC-DC converting circuit and configured to convert the DC bus voltage to an AC voltage. The insulation detecting circuit is electrically coupled between the DC-DC converting circuit and the DC-AC converting circuit. The insulation detecting circuit is configured to detect a ground impedance value of the power converting device according to the DC bus voltage.

17 Claims, 7 Drawing Sheets

(51) Int. Cl.
*G01R 27/18* (2006.01)
*G01R 15/14* (2006.01)
*G01R 31/40* (2014.01)
*G05B 15/02* (2006.01)
*H02M 3/04* (2006.01)
*H02M 3/158* (2006.01)
*H02M 7/5387* (2007.01)
*H02M 1/00* (2006.01)
*H02H 3/16* (2006.01)

(52) U.S. Cl.
CPC .............. *G05B 15/02* (2013.01); *H02J 3/383* (2013.01); *H02M 3/04* (2013.01); *H02H 3/16* (2013.01); *H02M 3/158* (2013.01); *H02M 7/5387* (2013.01); *H02M 2001/007* (2013.01); *Y02E 10/563* (2013.01)

(56) References Cited

U.S. PATENT DOCUMENTS

| | | | | |
|---|---|---|---|---|
| 8,184,461 | B2 * | 5/2012 | Mabuchi | H02J 3/383 363/124 |
| 8,373,420 | B2 * | 2/2013 | Lupaczyk | G01R 31/025 324/509 |
| 8,937,822 | B2 * | 1/2015 | Dent | H02M 7/53871 363/55 |
| 9,793,854 | B2 * | 10/2017 | Fornage | G01R 27/18 |
| 9,948,233 | B2 * | 4/2018 | Adest | H01L 31/02021 |
| 2002/0118559 | A1 * | 8/2002 | Kurokami | H02M 1/15 363/131 |
| 2012/0026631 | A1 * | 2/2012 | Kazemi | H02H 3/16 361/42 |
| 2012/0163048 | A1 | 6/2012 | Victor et al. | |
| 2014/0239968 | A1 * | 8/2014 | Ishii | H01L 31/02021 324/509 |
| 2015/0244253 | A1 * | 8/2015 | Chen | H02M 1/32 363/56.01 |
| 2016/0091554 | A1 | 3/2016 | Fornage et al. | |
| 2017/0184343 | A1 * | 6/2017 | Freer | F25D 11/003 |
| 2018/0259563 | A1 * | 9/2018 | Tsubota | H01H 83/02 |

FOREIGN PATENT DOCUMENTS

| | | |
|---|---|---|
| CN | 103091560 A | 5/2013 |
| CN | 102520254 B | 9/2013 |
| CN | 103558496 A | 2/2014 |
| CN | 104535839 A | 4/2015 |
| TW | M384459 U | 7/2010 |
| WO | 2016049856 A1 | 4/2016 |

* cited by examiner

POWER CONVERTING DEVICE AND GROUND IMPEDANCE VALUE DETECTING METHOD

RELATED APPLICATIONS

This application claims priority to Taiwan Application Serial Number 105121488, filed Jul. 7, 2016, which is herein incorporated by reference.

BACKGROUND

Technical Field

The present disclosure relates to a power converter, and in particular, to a power converter which is able to detect a ground impedance value.

Description of Related Art

In the solar power generating system nowadays, in order to be synchronized with the grid, power converting devices are required to convert the DC power output by the solar PV module to AC power.

However, if the grounding failure occurs in the power converting device, leakage current may be generated and results in the device failure or accident.

Therefore, a ground impedance detecting function is needed for the power converting device to guarantee the normal operation of the device.

SUMMARY

According to one aspect of the present disclosure, a power converting device is provided which includes a dc-dc converting circuit, a dc-ac converting circuit, and an insulation detecting circuit. The dc-dc converting circuit is configured to convert a dc input voltage to a dc bus voltage. The dc-ac converting circuit is electrically coupled to the dc-dc converting circuit and configured to convert the dc bus voltage to an ac voltage. The insulation detecting circuit is electrically coupled between the dc-dc converting circuit and the dc-ac converting circuit. The insulation detecting circuit is configured to detect a ground impedance value of the power converting device according to the dc bus voltage.

According to another aspect of the present disclosure, a power converting device is provided which includes a plurality of dc-dc converting circuits and an insulation detecting circuit. The dc-dc converting circuits are configured to convert a plurality of corresponding dc input voltages to a dc bus voltage. The insulation detecting circuit is electrically coupled to the dc-dc converting circuits. The insulation detecting circuit is configured to detect a ground impedance value of the power converting device according to the dc bus voltage.

According to another aspect of the present disclosure, a ground impedance value detecting method for a power converting device is provided, in which the method includes: converting, by a dc-dc converting circuit, a dc input voltage to a dc bus voltage; providing a dc-ac converting circuit configured to convert the dc bus voltage to an ac voltage; receiving, by an insulation detecting circuit, the dc bus voltage; and detecting, by the insulation detecting circuit, a ground impedance value of the power converting device according to the dc bus voltage.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
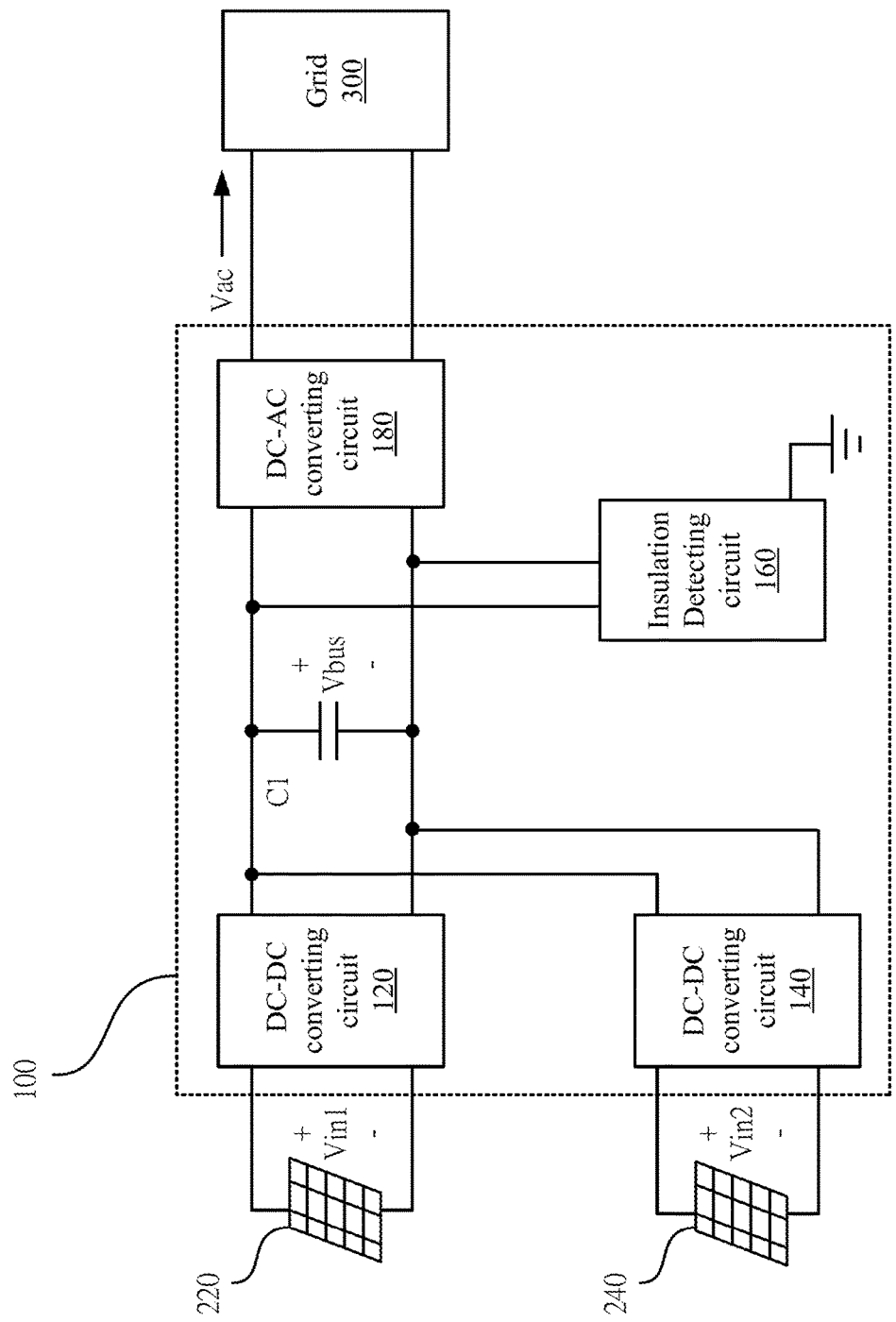
FIG. 1 is a diagram illustrating a power converting device according to some embodiments of the present disclosure.

The embodiments herein described are by examples, and are not intended to be limiting. Alternatives, modifications and equivalents may be included within the spirit and scope of the disclosure as defined by the appended claims. Drawings are not drawn to scale and not meant to limit the actual embodiments of the present disclosure. Wherever possible, same reference numbers are used in the drawings and the description to refer to the same or like parts for better understanding. While method steps are disclosed herein as a series of acts or events, some may occur in different orders and/or concurrently with other acts or events apart from those described herein. The term "coupled" and "connected" may be used to indicate that two or more elements cooperate or interact with each other, and may also be termed electrically coupled/connected. The terms "first," "second," etc., are used to distinguish one element from another.

Reference is made to FIG. 1, a power converting circuit 100 may be applied in a solar power generating system to convert a DC power output from solar PV panels to AC power. An input terminal of the power converting device 100 is electrically coupled to the solar PV power generating modules 220, 240, and configured to receive the DC input voltages Vin1, Vin2 provided by the solar PV power generating modules 220, 240 respectively, and convert the DC input voltages Vin1, Vin2 to an AC voltage Vac. For example, in some embodiments, the AC voltage Vac output by the power converting device 100 may be synchronized to a grid 300 to supply power to the grid 300. In addition, in some embodiments, the AC voltage Vac output by the power converting device 100 may also supply power directly to local loads with energy storage devices.

The power converting device 100 includes dc-do converting circuits 120, 140, an insulation detecting circuit 160, a dc-ac converting circuit 180 and a capacitor unit C1. The output terminals of the dc-dc converting circuits 120 and 140 are coupled in parallel to each other, and electrically coupled to the capacitor unit C1. The dc-ac converting circuit 180 is electrically coupled to the dc-dc converting circuits 120, 140. The insulation detecting circuit 160 is electrically coupled between the dc-dc converting circuits 120, 140 and the dc-ac converting circuit 180.

It is noted that, for the convenience of explanation, only two sets of solar PV power generating modules 220, 240 and corresponding dc-dc converting circuits 120, 140 are illustrated in the FIG. 1, but the present disclosure is not limited thereto. Specifically, in some embodiments, the solar PV power generating system may include three or more sets of solar PV power generating modules, and the power converting device 100 includes corresponding dc-dc converting circuit for each set of the solar PV power generating module.

In some embodiments, the dc-dc converting circuits 120, 140 are configured to convert the dc input voltages Vin1, Vin2 provided by solar PV power generating modules 220, 240 to the dc bus voltage Vbus respectively. For example, the dc-dc converting circuits 120, 140 may include boost converters or buck-boost converters in order to boost the dc input voltages Vin1, Vin2. Alternatively stated, in some embodiments, the voltage level of the dc bus voltage Vbus is higher than or equal to the voltage level of the dc input voltages Vin1, Vin2. Specifically, when the dc input voltages Vin1, Vin2 are low, the dc-dc converting circuits 120, 140 perform boost operation, and the voltage level of the dc bus voltage Vbus is higher than the voltage level of the dc input voltages Vin1, Vin2. In addition, in some states, when the solar PV power generating modules 220, 240 supply sufficient power and the dc input voltages Vin1, Vin2 provided exceed the preset voltage level of the dc bus voltage Vbus, the dc-dc converting circuits 120, 140 do not perform additional boost conversion, and the voltage level of the dc bus voltage Vbus is equal to the voltage level of the dc input voltages Vin1, Vin2.

In addition, when the solar radiation condition changes or partial shielding occurs, the corresponding dc-dc converting circuits 120, 140 may control the solar PV power generating modules 220, 240 operated at different power operating point in order to obtain the maximum power output, so as to realize maximum power point tracking (MPPT). In some embodiments, the power converting device 100 is configured that the output terminals of each sets dc-dc converting circuits 120, 140 are coupled in parallel to a capacitor unit C1 to output the dc bus voltage Vbus to the dc-ac converting circuit 180, such that the solar PV power generating modules 220, 240 may be operated with maximum efficiency to increase the overall power generation efficiency of the system.

As shown in the figure, a first terminal of the capacitor unit C1 is electrically coupled to the positive power line, and a second terminal of the capacitor unit C1 is electrically coupled to the negative power line. Thus, the dc bus voltage Vbus stored by the capacitor unit C1 may be provided via the positive power line and the negative power line from the dc-dc converting circuits 120, 140 to the dc-ac converting circuit 180.

Therefore, the dc-ac converting circuit 180 may convert the dc bus voltage Vbus to the ac voltage Vac and output the ac voltage Vac to the grid 300 or provide to the local loads.

In some embodiments, the insulation detecting circuit 160 arranged between the dc-dc converting circuits 120, 140 and the dc-ac converting circuit 180 may receive the dc bus voltage Vbus from the output terminals of the dc-dc converting circuits 120, 140, and detect a ground impedance value of the power converting device 100 according to the dc bus voltage Vbus.

Thus, since the insulation detecting circuit 160 detects the ground impedance value of the power converting device 100 according to the dc bus voltage Vbus which is boosted to a high voltage level, the insulation detecting circuit 160 may still detect the ground impedance value of the power converting device 100 accurately even if the voltage levels of the dc input voltages Vin1, Vin2 are low (such as from poor power generating ability, for example, during early in the morning, sunset, or cloudy weather).

In addition, even if the power converting device 100 includes multiple inputs and multiple sets of the corresponding dc-dc converting circuits 120, 140, only one insulation detecting circuit 160 is required to detect the ground impedance value, and there is no need to arrange multiple insulation detecting circuits 160 for each of the inputs. Therefore, the arrangement cost and the circuit area of the power converting device 100 may be reduced.

Figure 2:
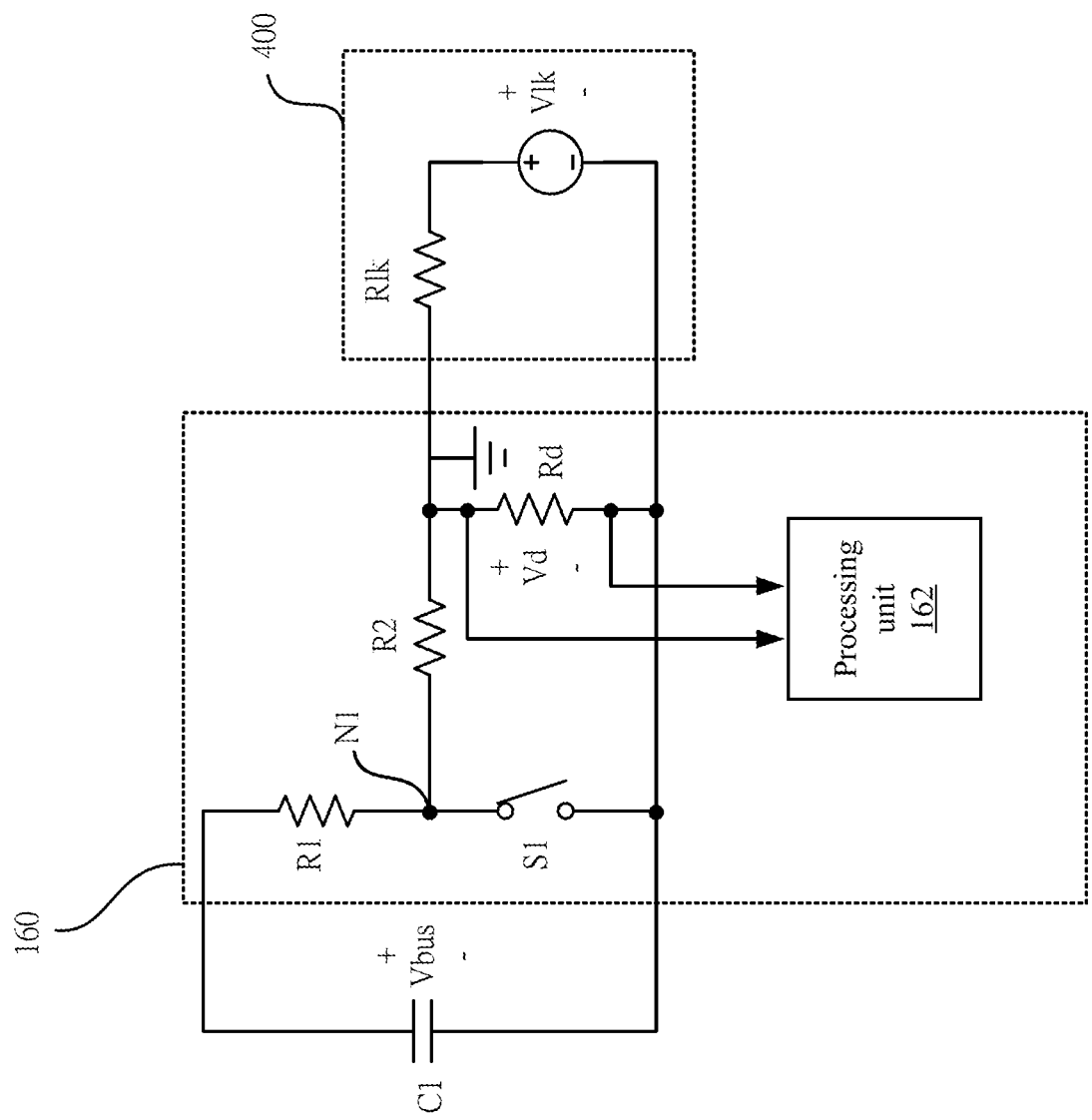
FIG. 2 is a diagram illustrating an insulation detecting circuit according to some embodiments of the present disclosure.

Referring to FIG. 2, in some embodiments, the insulation detecting circuit 160 includes a processing unit 162, resistors R1, R2, a detecting resistor Rd, and a switching unit S1. The resistor R1 is electrically coupled to the first terminal of the capacitor unit C1. The switching unit S1 is electrically coupled to the resistor R1 at the node N1, and electrically coupled to the second terminal of the capacitor unit C1. The resistor R2 is electrically coupled to the resistor R1 and the switching unit S1 at the node N1, and electrically coupled to the ground terminal. The detecting resistor Rd is electrically coupled between the ground terminal and the second terminal of the capacitor unit C1.

Generally, the ground impedance value of the power converting device 100 is considerably large. However, when the ground impedance is damaged somewhere in the machine, or a foreign matter 400 causes a grounding failure of the power converting device 100, as shown in FIG. 2, the foreign matter 400 has a leakage voltage Vlk and a leakage resistance Rlk to the ground, in which the leakage voltage Vlk indicates the voltage of the location where the foreign matter 400 contacts to the machine. If it is possible to detect the impedance value of the leakage resistance Rlk, the ground impedance value of the power converting device 100 at the time may be known.

In some embodiments, the processing unit 162 is configured to control the switching unit S1 to be on or off and calculate the ground impedance value according to the cross voltage Vd of the detecting resistor Rd. Specifically, the processing unit 162 controls the switching unit S1 to be on or off selectively, and respectively detects the cross voltage Vd of the detecting resistor Rd when the switching unit S1 is on and when the switching unit S1 is off, so as to calculate the ground impedance value according to the cross voltage Vd. For example, the processing unit 162 may achieve detecting the cross voltage Vd of the detecting resistor Rd by using various voltage or current sensing elements. One skilled in the art can understand how to implement the aforementioned voltage detection and thus further detail is omitted herein for the sake of brevity.

Figures 3A, 3B:
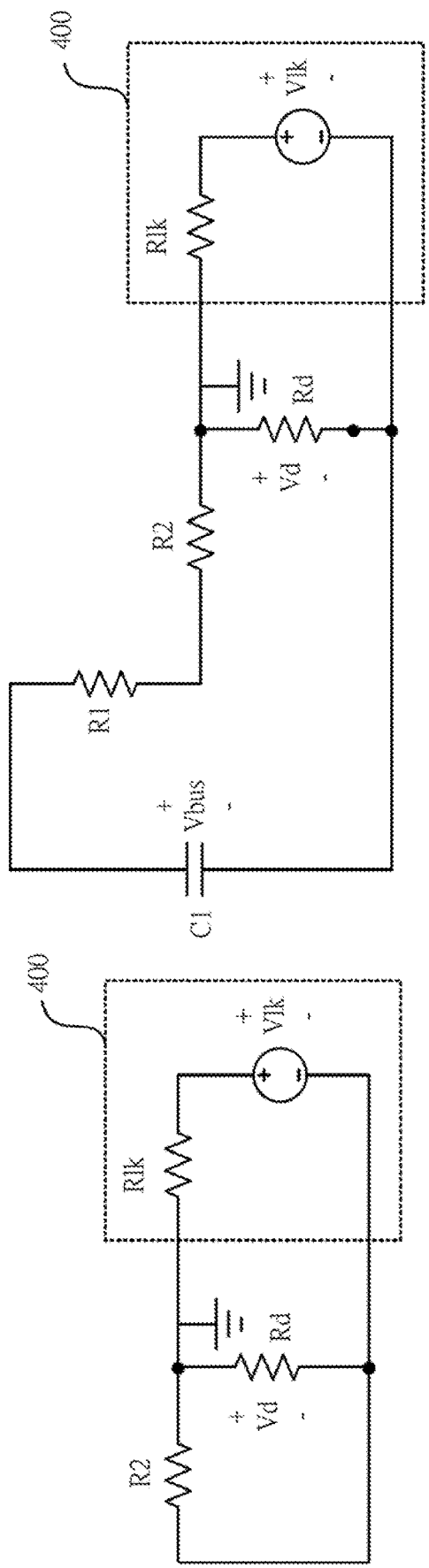
FIG. 3A and FIG. 3B are diagrams illustrating an insulation detecting circuit in operation according to some embodiments of the present disclosure.

Referring to FIG. 3A, when the switching unit S1 is on, the resistor R2 and the detecting resistor Rd are coupled to each other in parallel. At the time, based on the circuit shown in FIG. 3A, the processing unit 162 may obtain an equation of the unknown leakage voltage Vlk and the leakage resistance Rlk to ground according to the cross voltage Vd of the detecting resistor Rd.

When the switching unit S1 is off, as shown in FIG. 3B, the resistor R1, the resistor R2 and the detecting resistor Rd are coupled to each other in series. Based on the circuit shown in FIG. 3B, the processing unit 162 may obtain another equation of the unknown leakage voltage Vlk and the leakage resistance Rlk to ground according to the cross voltage Vd of the detecting resistor Rd.

Since the parameters of the resistors R1, R2 and the detecting resistor Rd are already known, and the dc bus voltage Vbus may be obtained by voltage detecting elements, the processing unit 162 may perform calculation according to the two equations to obtain the unknown leakage voltage Vlk and the leakage resistor Rlk. Therefore, the insulation detecting circuit 160 may detect the ground impedance value by the operation of turning on/off the switching unit S1 and performing respective calculations.

By the aforementioned operation, the insulation detecting circuit 160 may detect and calculate the ground impedance value of the power converting device 100. In addition, in some embodiments, the insulation detecting circuit 160 may be further configured to output a warning signal when the ground impedance value is lower than a predetermined safety limit value. For example, the insulation detecting circuit 160 may notify a user that there is the abnormal ground impedance value detected, by giving a warning signal, or stop the operation of the power converting device 100 so as to prevent potential device damage or accident.

It is noted that the insulation detecting circuit 160 may be realized in various ways, and the circuit shown in FIG. 2, FIG. 3A and FIG. 3B are merely one of the possible ways to achieve the insulation detecting circuit 160. For example, in some embodiments, the resistors R1, R2 and the detecting resistor Rd may be electrically coupled in different relationships compared to the embodiments shown in FIG. 2. One skilled in the art can derive corresponding two equations of the leakage voltage Vlk and the leakage resistance Rlk to ground based on the electric network analysis of fundamental circuitry, so as to design the corresponding processing unit 162 to perform the calculation to obtain the unknown leakage voltage Vlk and the leakage resistance Rlk.

Figure 4:
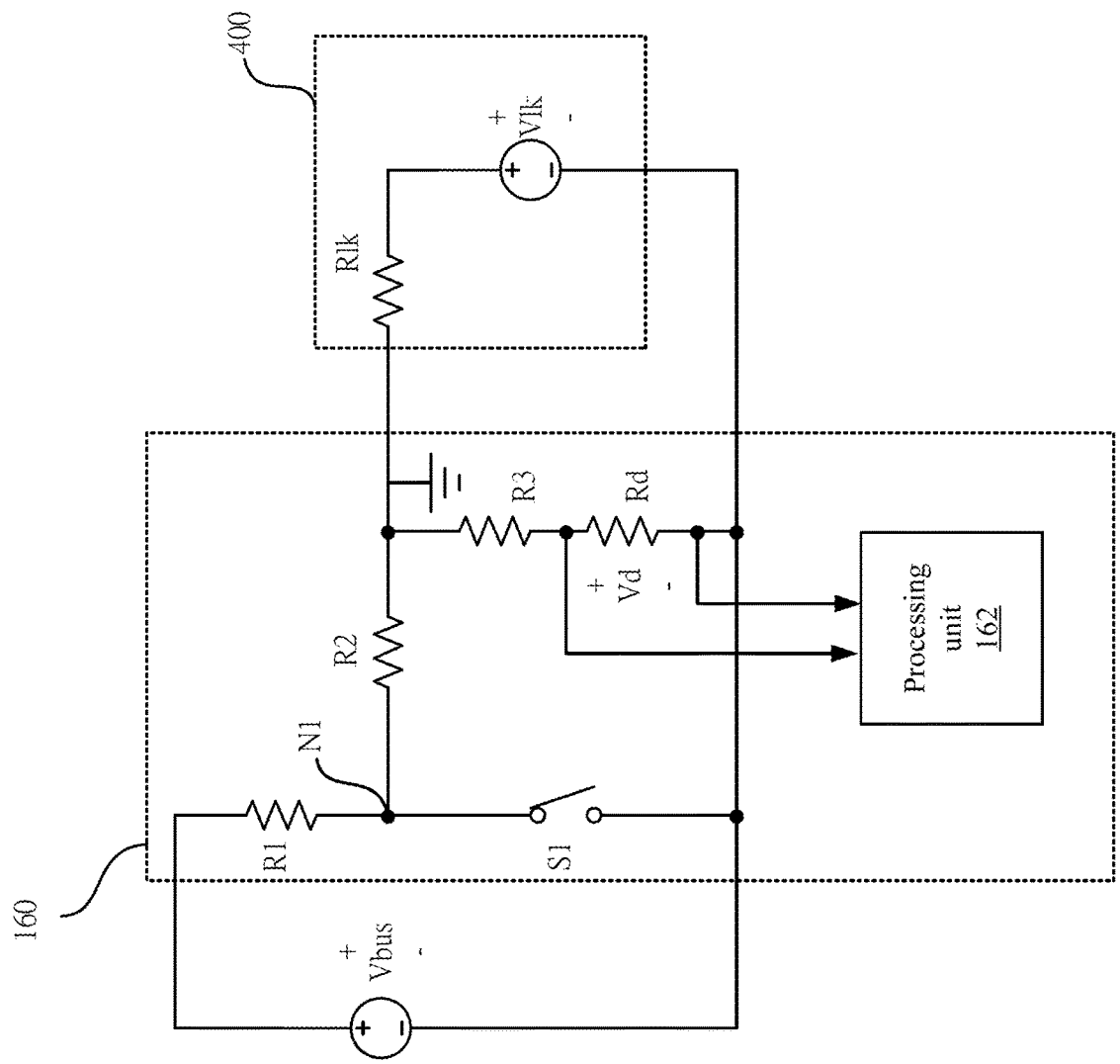
FIG. 4 is a diagram illustrating an insulation detecting circuit according to some other embodiments of the present disclosure.

Referring to FIG. 4, in some embodiments, the insulation detecting circuit 160 further includes a resistor R3. The resistor R3 is electrically coupled between the ground terminal and the detecting resistor Rd. Specifically, since the dc bus voltage Vbus may be boosted to a relatively high voltage level (e.g., 500-600V), in order to avoid the voltage signal received by the processing unit 162 being too large and damage the elements, the resistor R3 is arranged and the impedance of the resistor R3 is properly designed for voltage-division, such that the cross voltage Vd between two terminals of the detecting resistor Rd is maintained within a proper voltage operating region to protect the processing unit 162. Similarly, the circuit shown in FIG. 4 is also merely a possible implementation of the insulation detecting circuit 160 and is not meant to limit the present disclosure.

Figure 5:
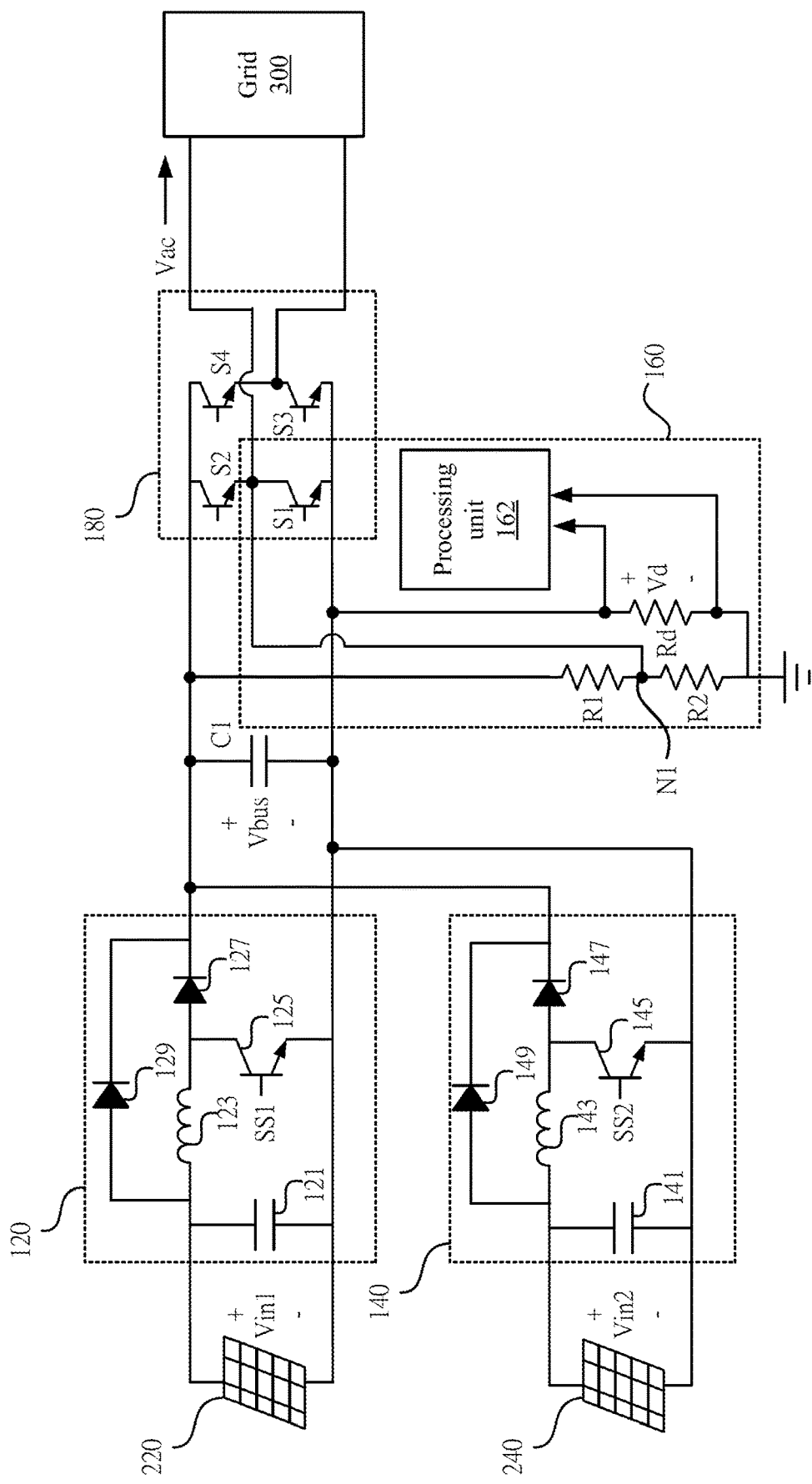
FIG. 5 is a diagram illustrating a power converting device according to some embodiments of the present disclosure.

Referring to FIG. 5, in some embodiments, the dc-dc converting circuits 120, 140 may include a boost converter. For example, the dc-dc converting circuit 120 may include a capacitive unit 121, an inductive unit 123, a switching unit 125 and diodes units 127, 129. The capacitive unit 121 is electrically coupled in parallel to the input terminal of the dc-dc converting circuit 120. A first terminal of the inductive unit 123 is electrically coupled to a first terminal of the capacitive unit 121. A first terminal of the switching unit 125 is electrically coupled to a second terminal of the inductive unit 123. A second terminal of the switching unit 125 is electrically coupled to a second terminal of the capacitive unit 121. A first terminal of the diode unit 127 is electrically coupled to the second terminal of the inductive unit 123. A second terminal of the diode unit 127 is electrically coupled to the output terminal of the dc-dc converting circuit 120. A first terminal of the diode unit 129 is electrically coupled to the first terminal of the inductive unit 123. A second terminal of the diode unit 129 is electrically coupled to the second terminal of the diode unit 127.

Thus, as a control terminal of the switching unit 125 receiving corresponding switching signal SS1, the dc-dc converting circuit 120 may output the dc bus voltage Vbus with the co-operation of the capacitive unit 121, the inductive unit 123, the switching unit 125, and the diode units 127 and 129.

Similarly, the dc-dc converting circuit 140 may also include corresponding capacitive unit 141, the inductive unit 143, the switching unit 145 and the diodes units 147, 149. The structural relationship and the operation of the circuit elements in the dc-dc converting circuit 140 are similar to the circuit elements in the dc-dc converting circuit 120, and thus further explanation is omitted for the sake of brevity.

When the power generated by the solar PV power generating modules 220, 240 is sufficient, and the dc input voltage Vin1 and Vin2 exceed the preset voltage level of the dc bus voltage Vbus, the dc input voltage Vin1 may be provided via the path of the inductive unit 123 and the diode unit 127, or the diode unit 129, to the capacitor unit C1. The dc input voltage Vin2 may also be provided via the path of the inductive unit 143 and the diode unit 147, or the diode unit 149, to the capacitor unit C1. Accordingly, the voltage level of the dc voltage Vbus is able to be equal to the voltage level of the dc input voltage Vin1 and Vin2.

As shown in FIG. 5, in some embodiments, a dc-ac converting circuit 180 is electrically coupled to the node N1 in the insulation detecting circuit 160, in which the dc-ac converting circuit 180 and the insulation detecting circuit 160 share the switching unit S1 to be the switch in the dc-ac converting circuit 180.

Specifically, in some embodiments, the dc-ac converting circuit 180 includes a plurality of switches, and is configured to convert the dc bus voltage Vbus to the ac voltage Vac by the corresponding operation of the switches. For example, as shown in FIG. 5, in some embodiments, the dc-ac converting circuit 180 may include a full-bridge dc-ac converter, and in the full-bridge dc-ac converter, the switching unit S1 is operated in accompany with the operation of the switching units S2, S3, and S4 to output the ac voltage Vac.

As shown in FIG. 5, in some embodiments, at the node N1, the second terminal of the resistor R1 and the first terminal of the resistor R2 are electrically coupled between the switching units S1 and S2 of the dc-ac converting circuit 180. Therefore, the dc-ac converting circuit 180 and the insulation detecting circuit 160 may share the switching unit S1. Accordingly, the switching unit S1 in the insulation detecting circuit 160 is configured to be the switch in the dc-ac converting circuit 180 at the same time.

Alternatively stated, the insulation detecting circuit 160 may use one of the switches (e.g., the switching unit S1) in the dc-ac converting circuit 180 as the switch in the insulation detecting circuit 160. By sharing the element, the circuit design of the power converting device 100 may be simplified and the amount of the switching elements required is reduced, which further reduces the manufacturing cost and the size of the circuit.

It is noted that, although the full-bridge dc-ac converter is applied to realize the dc-ac converting circuit 180 in the embodiment shown in FIG. 5, the present disclosure is not limited thereto. For example, in some other embodiments, the power converting device 100 may also choose a T-type neutral point damped (TNPC) converter or other dc-ac converters to realize the dc-ac converting circuit 180. Similarly, the insulation detecting circuit 160 may also share the switching unit S1 with the dc-ac converting circuit 180 implemented with various other circuit structures which provides lower manufacturing cost and reduce the circuit size.

It is noted that, in the above embodiments, the processing unit 162 may be implemented by various ways such as using a micro controller unit (MCU), a Complex Programmable Logic Device (CPLD), or a Field-programmable gate array (FPGA), etc. The resistors R1, R2, R3, and the detecting resistor Rd, the switching units S1-S4, the capacitive units C1, 121, 141, the inductive units 123, 143, the switching units 125, 145, and the diode units 127, 129, 147, and 149 may also be implemented by power electronic components.

In addition, the elements in the above embodiments may be implemented by various digital or analog circuits, and may also be implemented by different integrated circuit chips. Each element may also be integrated in a single digital control chip. The processing circuit may also be realized by various processors or other integrated circuit chips. The above list is merely exemplary and is not meant to be limitations of the present disclosure.

Figure 6:
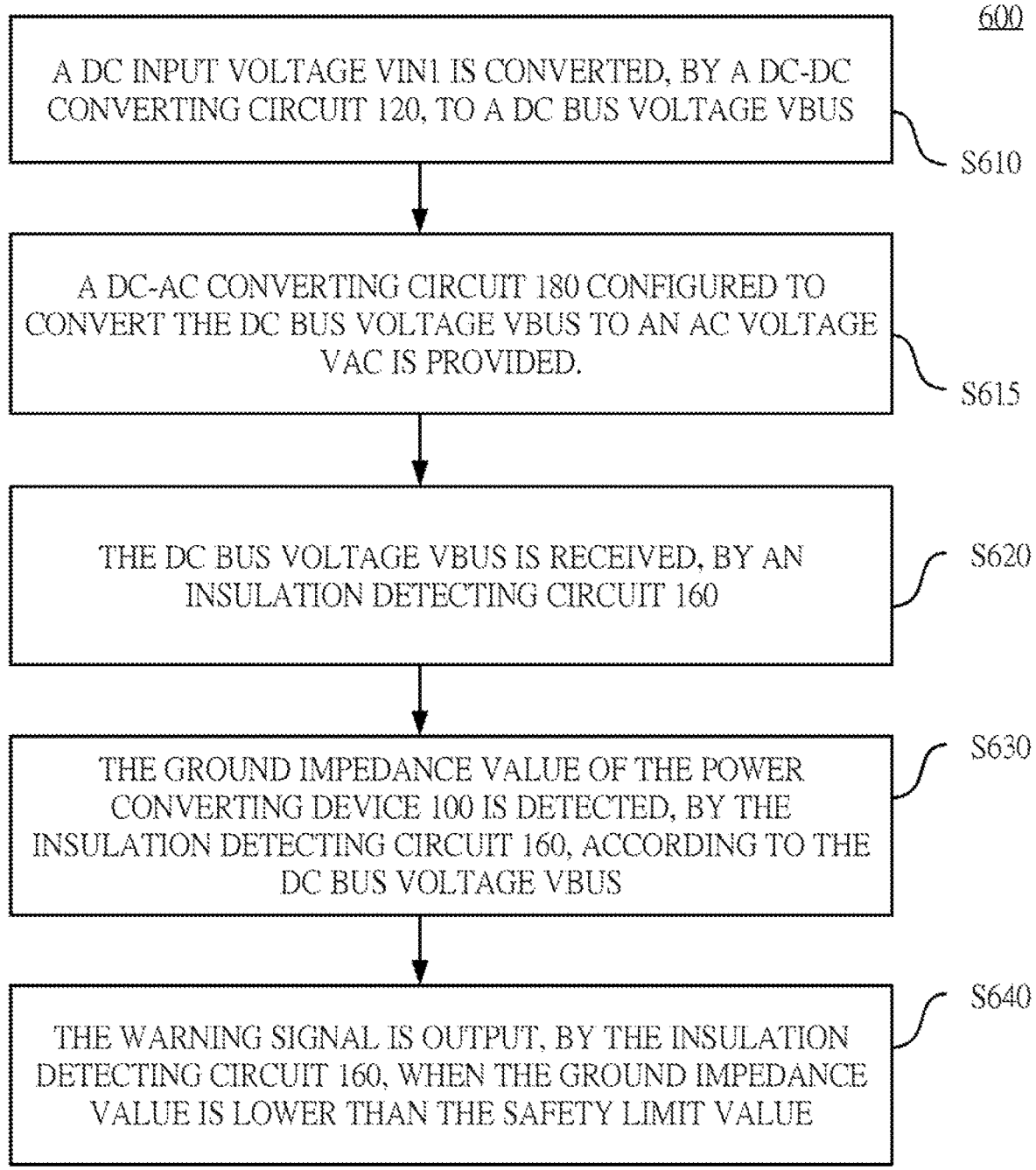
FIG. 6 is a flowchart diagram illustrating a ground impedance value detecting method according to some embodiments of the present disclosure.

Reference is made to FIG. 6, a ground impedance value detecting method 600 may be used in the power converting device 100. For better understanding of the present disclosure, the ground impedance value detecting method 600 is discussed in relation to the embodiments shown in FIG. 1-FIG. 5, but is not limited thereto. As shown in FIG. 6, the ground impedance value detecting method 600 includes steps S610, S615, S620 and S630.

First, in the step S610, the dc input voltage Vin1 is converted, by the dc-dc converting circuit 120, to the dc bus voltage Vbus. In some embodiments, in the step S610, multiple dc input voltages Vin1, Vin2 may be converted, by multiple dc-dc converting circuits 120, 140, to the dc bus voltage Vbus. In some embodiments, in the step S615, a dc-ac converting circuit 180 configured to convert the dc bus voltage Vbus to the ac voltage Vac is provided. Alternatively stated, the dc bus voltage Vbus is configured to be converted to the ac voltage Vac by the dc-ac converting circuit 180.

Next, in the step S620, the dc bus voltage Vbus is received, by the insulation detecting circuit 160. Next, in the step S630, the ground impedance value of the power converting device 100 is detected, by the insulation detecting circuit 160, according to the dc bus voltage Vbus.

In some embodiments, the ground impedance value detecting method 600 further includes the step S640. In the step S640, the warning signal is output, by the insulation detecting circuit 160, when the ground impedance value is lower than the safety limit value.

Figure 7:
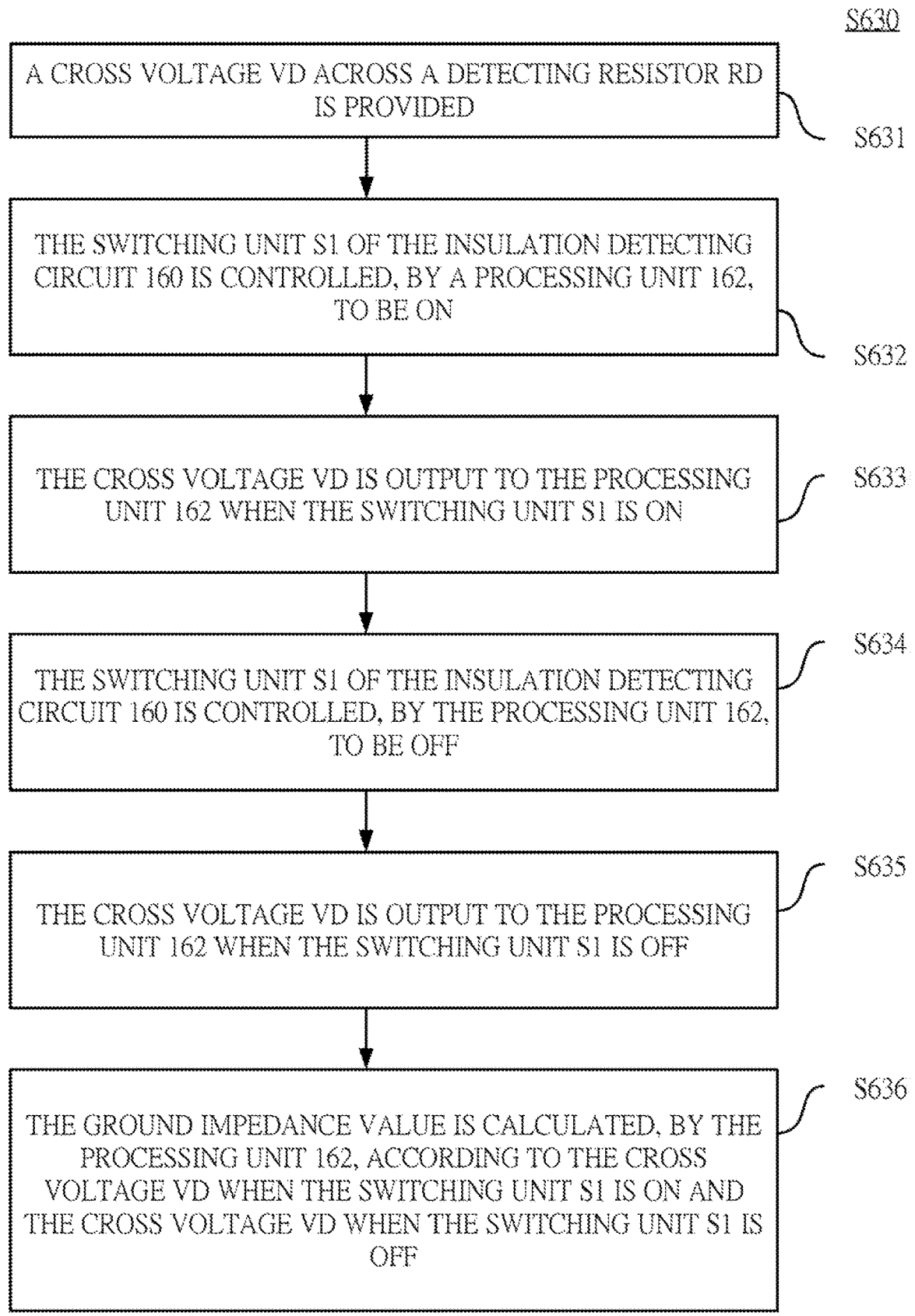
FIG. 7 is a flowchart diagram illustrating a step of the ground impedance value detecting method shown in FIG. 6 according to some embodiments of the present disclosure.

Reference is made to FIG. 7 illustrating further steps of the step 630 according to some embodiments of the present disclosure. The further steps of step S630 include steps S631, S632, S633, S634, S635 and S636.

First, in the step S631, a cross voltage Vd across a detecting resistor Rd is provided.

Next, in the step S632, the switching unit S1 of the insulation detecting circuit 160 is controlled, by the processing unit 162, to be on. Next, in the step S633, the cross voltage Vd of the detecting resistor Rd is output to the processing unit 162 when the switching unit S1 is on.

Next, in the step S634, the switching unit S1 of the insulation detecting circuit 160 is controlled, by the processing unit 162, to be off. Next, in the step S635, the cross voltage Vd of the detecting resistor Rd is output to the processing unit 162 when the switching unit S1 is off.

In the step S636, the ground impedance value is calculated, by the processing unit 162, according to the cross voltage Vd of the detecting resistor Rd when the switching unit S1 is on and the cross voltage Vd of the detecting resistor Rd when the switching unit S1 is off. It is noted that, in some embodiments, the dc-ac converting circuit 180 and the insulation detecting circuit 160 share the switching unit S1 to be the switch in the dc-ac converting circuit 180.

In summary, in the present disclosure, the dc bus voltage which may be boosted to a relatively high voltage level is used by the insulation detecting circuit 160 to detect the ground impedance value of the power converting circuit 100. The insulation detecting circuit 160 may still detect the ground impedance value of the power converting device 100 accurately even if the voltage levels of the dc input voltages Vin1, Vin2 are low (such as due to poor power generating ability, for example, during early in the morning, sunset, or cloudy weather), and thus the accuracy of detecting the ground impedance value is improved. In some embodiments, by the insulation detecting circuit 160 and the dc-ac converting circuit 180 sharing the switching unit S1, the circuit design may be simplified, and the manufacturing cost and the circuit size of the power converting device 100 and the insulation detecting circuit 160 are reduced.

What is claimed is:

1. A power converting device, comprising:
a dc-dc converting circuit configured to convert a dc input voltage to a dc bus voltage;
a dc-ac converting circuit electrically coupled to the dc-dc converting circuit and configured to convert the dc bus voltage to an ac voltage; and
an insulation detecting circuit electrically coupled between the dc-dc converting circuit and the dc-ac converting circuit and electrically coupled to a ground terminal, and configured to receive the dc bus voltage,
wherein the insulation detecting circuit is configured to detect a ground impedance value of the power converting device according to the received dc bus voltage,
wherein the insulation detecting circuit comprises:
a switching unit configured to be configured to be electrically coupled to the dc bus voltage;
a detecting resistor configured to provide a cross voltage across the detecting resistor; and
a processing unit configured to control the switching unit to effect a change to the cross voltage and calculate the ground impedance value according to the cross voltage.

2. The power converting device of claim 1, wherein the dc bus voltage is transmitted via a positive power line and a negative power line from the dc-dc converting circuit to the dc-ac converting circuit, and the power converting device further comprises a capacitor unit, and a first terminal of the capacitor unit is electrically coupled to the positive power line, and a second terminal of the capacitor unit is electrically coupled to the negative power line.

3. The power converting device of claim 2, wherein the detecting resistor is electrically coupled between the ground terminal and the second terminal of the capacitor unit, wherein the insulation detecting circuit further comprises:
a first resistor electrically coupled to the first terminal of the capacitor unit, wherein the switching unit is electrically coupled to the first resistor at a node and further electrically coupled to the second terminal of the capacitor unit; and
a second resistor electrically coupled to the first resistor and the switching unit at the node, wherein the second resistor is further electrically coupled to the ground terminal.

4. The power converting device of claim 3, wherein the insulation detecting circuit further comprises a third resistor electrically coupled between the ground terminal and the detecting resistor.

5. The power converting device of claim 3, wherein the dc-ac converting circuit is further electrically coupled to the node.

6. The power converting device of claim 1, wherein the insulation detecting circuit is further configured to output a warning signal when the ground impedance value is lower than a predetermined limit value.

7. The power converting device of claim 1, wherein the dc-ac converting circuit and the insulation detecting circuit share use of the switching unit.

8. The power converting device of claim 1, further comprising:
a second dc-dc converting circuit configured to convert a second dc input voltage to the dc bus voltage.

9. The power converting device of claim 1, wherein the dc-dc converting circuit comprises a boost converter, and the dc bus voltage is higher than or equal to the dc input voltage.

10. The power converting device of claim 1, wherein the dc-ac converting circuit is further configured to output the ac voltage to a grid.

11. A power converting device, comprising:
a dc-ac converting circuit;
a plurality of dc-dc converting circuits configured to convert a plurality of dc input voltages to a dc bus voltage; and
an insulation detecting circuit electrically coupled between the plurality of dc-dc converting circuits and the dc-ac converting circuit and further electrically coupled to a ground terminal, and configured to receive the dc bus voltage, wherein the insulation detecting circuit is configured to detect a ground impedance value of the power converting device according to the received dc bus voltage,
wherein the insulation detecting circuit comprises:
a switches unit;
a detecting resistor configured to provide a cross voltage across the detecting resistor; and
a processing unit, wherein the processing unit is configured to control the switching unit to be on or off selectively and calculate the ground impedance value according to the cross voltage when the switching unit is selected to be on and the cross voltage when the switching unit is selected to be off.

12. The power converting device of claim 11, further comprising:
a capacitor unit comprising a first terminal electrically coupled to a positive power line and further comprising a second terminal electrically coupled to a negative power line;
wherein the plurality of dc-dc converting circuits are configured to transmit the dc bus voltage to the dc-ac converting circuit via the positive power line and the negative power line, and wherein the dc-ac converting circuit is configured to convert the dc bus voltage to an ac voltage.

13. The power converting device of claim 12, wherein the detecting resistor is electrically coupled between the ground terminal and the second terminal of the capacitor unit, wherein the insulation detecting circuit further comprises:
a first resistor electrically coupled to the first terminal of the capacitor unit, wherein the switching unit is electrically coupled to the first resistor at a node and further electrically coupled to the second terminal of the capacitor unit; and
a second resistor electrically coupled to the first resistor and the switching unit at the node, wherein the second resistor is further electrically coupled to the ground terminal.

14. The power converting circuit of claim 13, wherein the dc-ac converting circuit is electrically coupled to the first resistor and the second resistor at the node, and wherein the dc-ac converting circuit and the insulation detecting circuit shares the switching unit such that the switching unit is configured to be operable in the dc-ac converting circuit.

15. A ground impedance value detecting method for a power converting device, the method comprising:
converting, by a dc-dc converting circuit, a dc input voltage to a dc bus voltage;
providing a dc-ac converting circuit configured to convert the dc bus voltage to an ac voltage;
receiving, by an insulation detecting circuit electrically coupled to a ground terminal, the dc bus voltage, wherein the insulation detecting circuit is electrically coupled between the dc-dc converting circuit and the dc-ac converting circuit; and
detecting, by the insulation detecting circuit, a ground impedance value of the power converting device according to the received dc bus voltage, wherein detecting the ground impedance value comprises;
providing a cross voltage across a detecting resistor;
controlling, by a processing unit, a switching unit of the insulation detecting circuit ,to be on;
outputting the cross voltage to the processing unit when the switching unit is on;
controlling, by the processing unit, the switching unit of the insulation detecting circuit, to be off;
outputting the cross voltage to the processing unit when the switching unit is off; and
calculating, by the processing unit, the ground impedance value according to the cross voltage when the switching unit is on and the cross voltage when the switching unit is off.

16. The ground impedance value detecting method of claim 15, further comprising sharing the switching unit by the dc-ac converting circuit and the insulation detecting circuit such that the switching unit is operable in the dc-ac converting circuit.

17. The ground impedance value detecting method of claim 15, further comprising:
outputting, by the insulation detecting circuit, a warning signal when the ground impedance value is lower than a predetermined limit value.

* * * * *